(12) United States Patent
Lee et al.

(10) Patent No.: US 6,927,142 B2
(45) Date of Patent: Aug. 9, 2005

(54) METHOD FOR FABRICATING CAPACITOR IN SEMICONDUCTOR DEVICE

(75) Inventors: Joon Hyeon Lee, Chungcheongbuk-do (KR); Seung Hee Han, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 100 days.

(21) Appl. No.: 10/705,096

(22) Filed: Nov. 10, 2003

(65) Prior Publication Data
US 2005/0014343 A1 Jan. 20, 2005

(30) Foreign Application Priority Data
Jul. 15, 2003 (KR) ................... 10-2003-0048225

(51) Int. Cl.[7] ............................................. H01L 21/20
(52) U.S. Cl. ................................................ 438/396
(58) Field of Search ........................ 438/396–399, 438/381–395, 171, 190, 210, 228, 329

(56) References Cited

U.S. PATENT DOCUMENTS 6,452,779 B1 * 9/2002 Adler et al. ............ 361/306.3

* cited by examiner

Primary Examiner—Craig A. Thompson
(74) Attorney, Agent, or Firm—Ladas & Parry LLP

(57) ABSTRACT

Disclosed is a method of fabricating a capacitor of a semiconductor device, which can produce an MIM capacitor in which an insulator film is formed to have a positive slope by means of a polymer, thereby preventing leakage of current in the capacitor. The method comprises the steps of: sequentially forming a first metal film, an insulator film, and a second metal film on a semiconductor substrate; patterning a second metal film to form an upper electrode; etching the insulator film using the upper electrode as a mask, and simultaneously forming a polymer at one side of the upper electrode; etching the insulator film which is not protected by the polymer, thereby removing the insulator film; and removing the polymer formed at said one side of the upper electrode.

7 Claims, 6 Drawing Sheets

METHOD FOR FABRICATING CAPACITOR IN SEMICONDUCTOR DEVICE

BACKGROUND OF THE INVENTION

1. Field of the Invention

The present invention relates to a method for fabricating a capacitor in semiconductor device, particularly to a method for fabricating a capacitor having a Metal-Insulator-Metal (hereinafter, referred to as "MIM") structure.

2. Description of the Prior Art

In general, MIM capacitors are employed to construct analog circuits of Radio Frequency band in manufacturing semiconductor integrated circuits. An MIM capacitor has a Metal-Insulator-Metal structure having upper and lower electrodes between which an insulator is interposed. Also, the upper and lower electrodes of the MIM capacitor are made from materials which have nearly no depletion and a low resistance. Therefore, the MIM capacitor has a higher Quality Factor (Q) than a PIP (Poly-Insulator-Poly) or PIM (Poly-Insulator-Metal) capacitor.

FIGS. 1A to 1G are sectional views to explain a method of fabricating a conventional MIM capacitor.

First, referring to FIG. 1A, in the conventional method for fabricating an MIM capacitor, a first metal film 100, an insulator film 102, and a second metal firm 104 are sequentially formed on a semiconductor substrate.

The first metal film 100 includes a Ti/TiN film 100a, an Al film 10b, and a Ti/TiN film 100c, which are sequentially formed on the semiconductor substrate. The second metal film 104 has a single layer structure of a TiN film formed on the insulator film 102.

The first metal film 100 may have a lamination structure of either a Ti/TiN/Al/Ti/TiN or TiN/Al/Ti/TiN. In contrast, the second metal film 104 may have a single layer structure made from either Ti/TiN, or TiN, or Al, or W, or another specific metal, or their combination.

The Al film 100a has a low resistance, and thus can function as a layer to transfer a substantial electric signal. The Al film 100a may be replaced by a film made from tungsten (W). The Ti in the Ti/TiN film 100c functions as an adhesive film to improve cohesion between layers on and beneath the adhesive film, which are made from different materials. Further, the TiN in the Ti/TiN film 100c functions as an anti-reflective coat layer which absorbs light to reduce the reflection of light when the photo-resist is patterned.

Meanwhile, the insulator film 102 is formed of an oxide having a high dielectric constant. In general, the insulator film 102 is a film made from silicon-oxy-nitride ($SiO_xN_y$) and silicon-nitride ($Si_3N_4$) or an oxide film formed by PECVD (Plasma-Enhanced Chemical Vapor Deposition).

Meanwhile, it should be noted that, even though not shown, a contact plug is formed under the first metal film 100 in order to electrically connect the first metal film 100 and a semiconductor substrate mounting integrated semiconductor devices thereon with each other, between which an interlayer insulator film, namely, a PMD (Pre Metal Dielectric) or an IMD (Inter Metal Dielectric) film, is interposed.

Referring to FIG. 1B, photo-resist is applied on the second metal film 104 and is then patterned to form a photo-resist pattern 106 defining an upper electrode of the MIM capacitor.

Referring to FIG. 1C, the upper electrode 104a of the MIM capacitor is formed by dry-etching the second metal 104 by means of plasma activated by combination of $Cl_2$/$BCL_3$/$N_2$ gas while using the photo-resist 106 formed on the second metal film 104 as a mask.

Next, the photo-resist pattern 106 is removed, and then the insulator film 102 is dry-etched using the upper electrode 104a as a mask by plasma activated by combination of $C_xF_y$ gas which mainly consists of C and F, for example: $CF_4$, $C_2F_6$, $C_4F_8$, $C_5F_8$, etc., so as to form a remaining insulator film 102a. In this case, the remaining insulator film 102a has an undercut "A" formed under the second metal film 104 as shown in FIG. 1c.

Such an undercut is generated because the insulator film 102 under the second metal film 104 is etched by ion sputtering generated when plasma ions contact with the first metal film 100 during plasma etching.

Referring to FIG. 1D, photo-resist is applied on the entire surface of the resultant lamination obtained through the above process and is then patterned to form a photo-resist pattern 108.

Referring to FIG. 1E, the first metal film 100 is etched using the photo-resist pattern 108 as a mask by plasma activated by combination of $Cl_2$/$BCL_3$/$N_2$ gas, so as to form a lower metal wiring film 110a and a lower electrode 10b of the MIM capacitor. As a result, the first metal film 100 is divided into a lower metal wiring region and an MIM capacitor region. Thereafter, the photo resist pattern 108 is removed.

Referring to FIG. 1f, an interlayer insulator film 112 is formed on a resultant lamination obtained through the above process, and chemical mechanical polishing (CMP) is performed to flatten a surface of the interlayer insulator film 112 while adjusting the thickness of the interlayer insulator film 112. Here, if a single film of an oxide film material is used to form the interlayer insulator film 112, the surface topology of the lower metal wiring region and the MIM capacitor region prevents the interlayer insulator film 112 from being completely flattened.

Accordingly, for the complete flatness of the interlayer insulator film 112, the interlayer insulator film 112 is preferably formed by a single BPSG film or a lamination including at least double films of a PE-TEOS film 112b and a flattening film 112a such as SOG, FOX and FSG.

Referring to FIG. 1g, predetermined portions of the interlayer insulator 112 are selectively etched to form via holes through which portions of the lower metal wiring film 110a and the lower and upper electrodes 110b and 104a of the MIM capacitor. Thereafter, conductive material such as tungsten (W) or copper (Cu) is filled in via holes, so as to form contact plugs 114a, 114b and 114c in the via holes.

Subsequently, a metal film having a lamination structure of Ti/TiN/Al/Ti/TiN, like the first and second metal films 100 and 104, is formed on the entire surface of the resultant device obtained through the process described above, and is then patterned to form upper metal wiring films 116a, 116b and 116c.

However, in the conventional method for making an MIM capacitor, the undercut generated while the upper electrode is formed functions as a source causing leakage of current when the lower and upper electrodes 110b and 104a of the MIM capacitor are electrically connected with the upper metal wiring film 116b and 116c.

In order to solve the above-mentioned problems, if the etching quantity of the insulator film 102 is reduced by controlling progress of the plasma dry-etching, a bridge is formed between the lower electrode and the upper electrode of the MIM capacitor when the upper metal wiring film is formed.

SUMMARY OF THE INVENTION

Accordingly, the present invention has been made to solve the above-mentioned problems occurring in the prior art, and an object of the present invention is to provide a method of fabricating a capacitor of a semiconductor device, which can produce an MIM capacitor in which an insulator film is formed to have a positive slope by means of a polymer, thereby preventing leakage of current in the capacitor.

In order to accomplish this object, there is provided a method of fabricating a capacitor of a semiconductor device, the capacitor having a structure of metal-insulator-metal, the method comprising the steps of: sequentially forming a first metal film, an insulator film, and a second metal film on a semiconductor substrate; patterning a second metal film to form an upper electrode; etching the insulator film using the upper electrode as a mask, and simultaneously forming a polymer at one side of the upper electrode; etching the insulator film which is not protected by the polymer, thereby removing the insulator film; and removing the polymer formed at said one side of the upper electrode.

Preferably, the method according to the present invention further comprises the steps of: forming interlayer insulator film on an entire surface of a first resultant lamination formed through above steps; forming at least two via holes by etching the interlayer insulator film; forming contact plugs by filling conductive metal in the via holes; and forming at least two upper metal wiring films on a second resultant lamination formed through above steps.

BRIEF DESCRIPTION OF THE DRAWINGS

The above object, features and advantages of the present invention will be more apparent from the following detailed description taken in conjunction with the accompanying drawings, in which.

DETAILED DESCRIPTION OF THE PREFERRED EMBODIMENTS

Hereinafter, preferred embodiments of the present invention will be described with reference to the accompanying drawings.

FIGS. 2A to 2F are sectional views to explain a method of fabricating an MIM capacitor in accordance with an embodiment of the present invention.

Figure 1A:
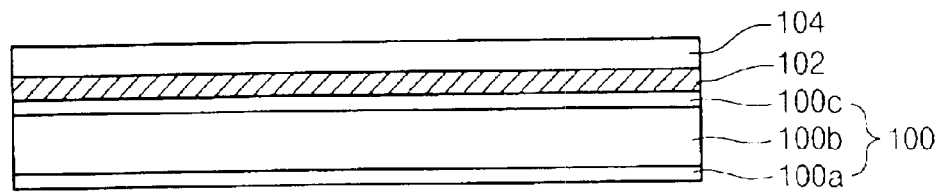
FIGS. 1A to 1G are sectional views to explain a method of fabricating a conventional MIM capacitor.
Figure 1B:
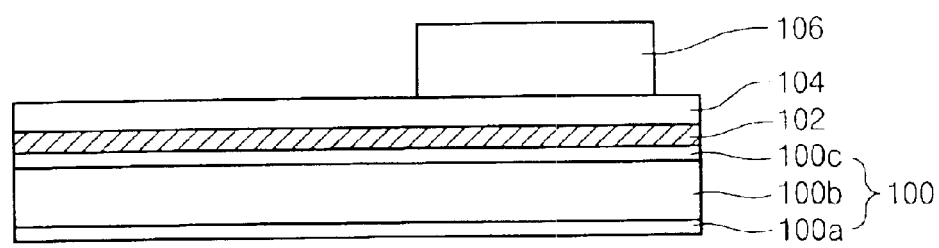
Figure 1C:
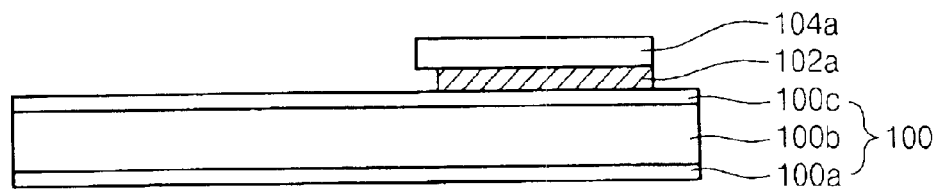
Figure 1D:
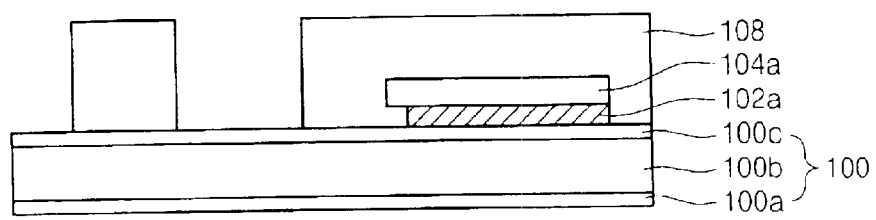
Figure 1E:
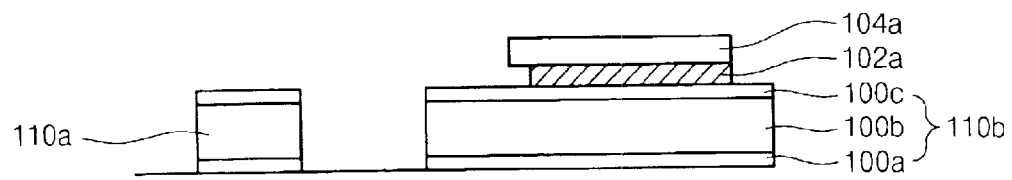
Figure 1F:
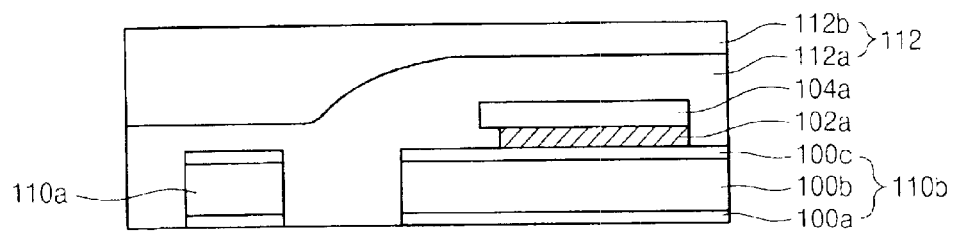
Figure 1G:
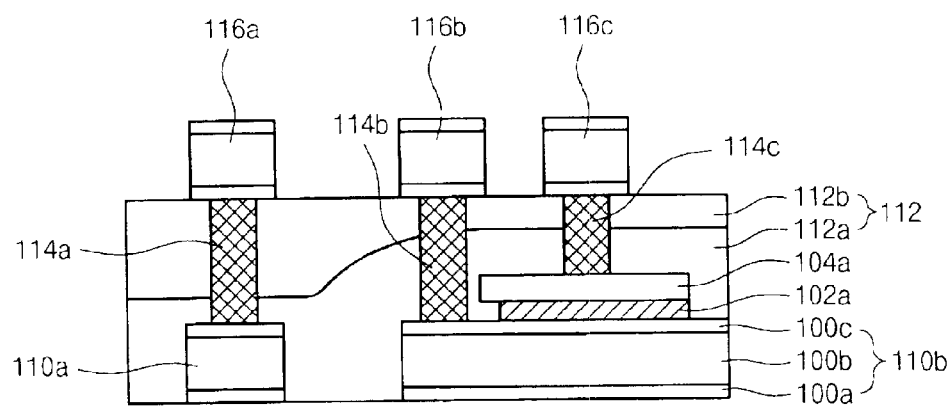
Figure 2A:
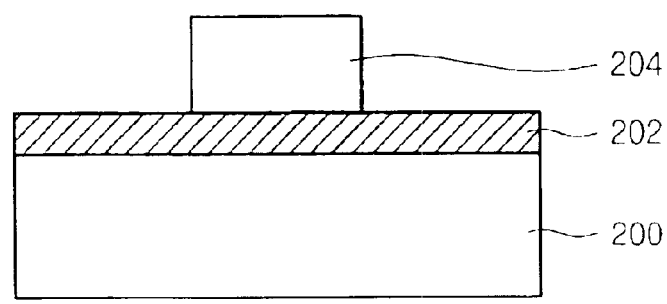
FIGS. 2A to 2F are sectional views to explain a method of fabricating an MIM capacitor in accordance with an embodiment of the present invention.

Referring to FIG. 2A, first of all, a first metal film 200, an insulator film 202, and a second metal film (not shown) are sequentially formed on a semiconductor substrate.

The first metal film 200 is formed on the semiconductor substrate with a structure of Ti/TiN/Al/Ti/TiN or TiN/Al/Ti/TiN. The second metal film (not shown) is a film to form an upper electrode of the MIM capacitor and is formed by depositing a single TiN film on the insulator film 202.

Also, the second metal film (not shown) may have a lamination structure in which Ti/TiN, TiN, Al, W and a specified metal, etc., are combined together, or have a single structure of Ti/TiN, TiN, Al, W, or a specified metal.

Meanwhile, the insulator 202 is formed with an oxide having a high dielectric constant. In general, the insulator 202 is formed of an oxide film made from silicon-oxy-nitride ($SiO_XN_Y$) and silicon-nitride ($Si_3N_4$) or formed through PECVD (Plasma-Enhanced Chemical Vapor Deposition).

On the other side, it should be noted that, even though not shown, a contact plug is formed under the first metal film 200 in order to electrically connect the first metal film 200 and a semiconductor substrate mounting integrated semiconductor devices thereon with each other, between which an interlayer insulator film, namely, a PMD (Pre Metal Dielectric) or an IMD (Inter Metal Dielectric) film, is interposed.

Next, photoresist is applied on the second metal film and is then patterned to form a photo-resist pattern (not shown) defining an upper electrode of the MIM capacitor.

Thereafter, the second metal (not shown) is dry-etched by means of plasma activated by combination of $Cl_2/BCL_3/N_2$ gas while using the photo-resist formed on the second metal film as a mask. As a result, the upper electrode 204 of the MIM capacitor is formed.

Figure 2B:
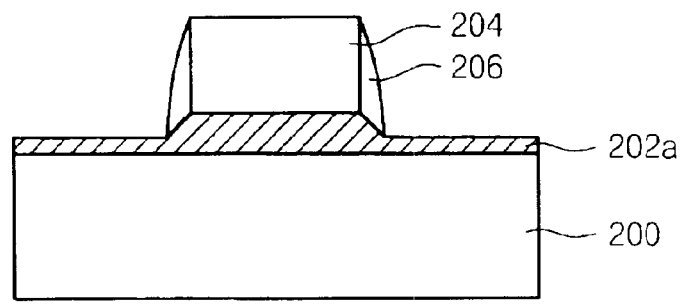
Figure 2C:
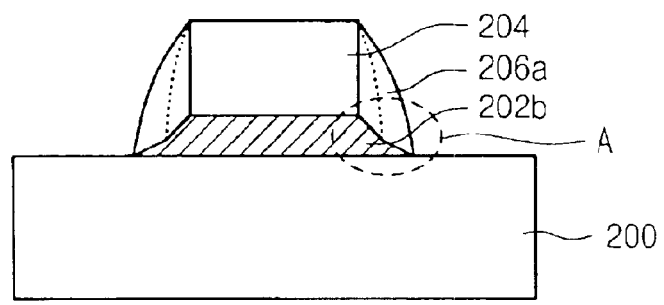

Referring to FIG. 2B, the photo-resist pattern is removed. Then, the exposed insulator film is dry-etched during a predetermined period of time, and simultaneously a first polymer 206 is formed at one side of the upper electrode 204. Hence, a part of the insulator film is etched to remain a remaining insulator film 202a, and a slope is formed at a boundary between the remaining insulator film 202a and first polymer 206.

Referring to FIG. 2B, during the etching as described above, the thickness of the first polymer 206 is further increased as time goes on to form a second polymer 206a, and the remaining insulator film 202a which is not protected by the second polymer 206a is completely removed. At this time, a bent slope having double inclinations is formed at a boundary between the insulator film 202b and the second polymer 206a. Although the present embodiment employs a bent slope having double positive inclinations as designated by reference mark "A", other embodiments of the present invention may employ a slope which has a single inclination or multiple inclinations of at leas triple inclinations.

When the second polymer 206a is formed according to the present invention, $CHF_3$ and $CF_4$ gas with a high pressure and source powers of middle level and lower levels are used. Herein, more or equal quantity of $CHF_3$ gas is used in comparison with the quantity of $CF_4$ gas.

Further, according to another embodiment of the present invention, $C_XF_Y$ may be used in place of $CHF_3$ and $CF_4$ gas in order to generate the second polymer 206a.

Therefore, according to the present invention, the second polymer 206a functions as a protect film against etching, thereby preventing undercut from being formed under the upper electrode 204.

Figure 2D:
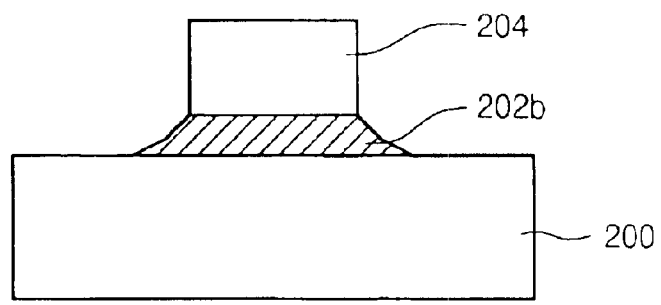

Referring to FIG. 2D, the resultant object obtained through the above process is washed to remove the second polymer 206a, thereby preventing the second polymer 206a from being a contaminating source in the following process, which may degrade the quality of the semiconductor device.

Figure 2E:
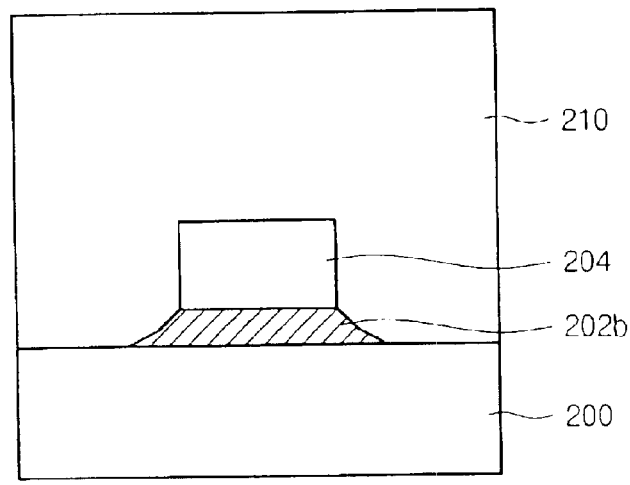

Referring to FIG. 2E, the first metal film 200 is patterned to be divided into a lower metal wiring region and an MIM capacitor region and to form a lower electrode 200a of the MIM capacitor. Subsequently, an interlayer insulator film 210 is formed on the entire surface of a resultant lamination obtained through the above, and is then flattened by a CMP process.

Figure 2F:
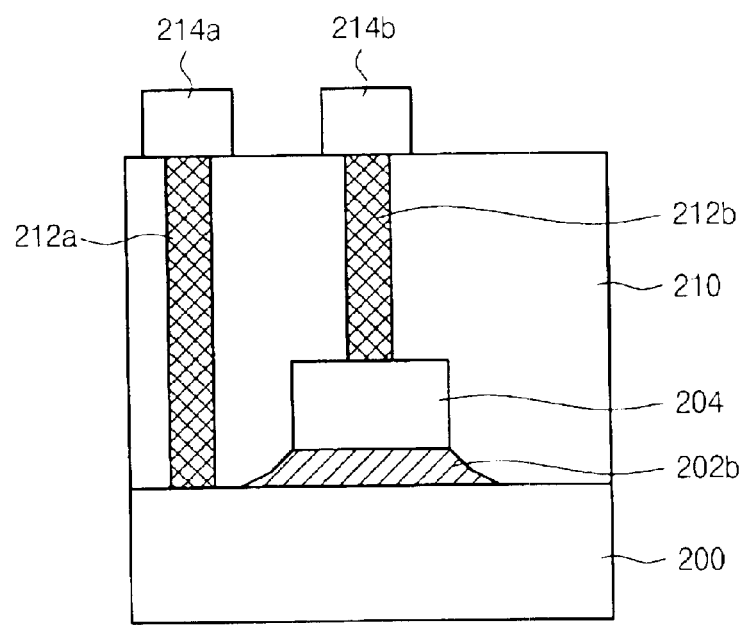

Referring to FIG. 2F, via holes are formed through the interlayer insulator film 210 by etching the interlayer insulator film 210, and conductive materials such as tungsten (W) or copper (Cu) are filled in the via holes to form contact plugs 212a and 212b. The contact plugs 212a and 212b enable the lower electrode 200a and the upper electrode 204 of the MIM capacitor to be electrically connected with an upper metal wiring film which will be formed in the following process.

Next, conductive metal is deposited on the entire surface of the resultant lamination obtained through the above process and is then patterned to form upper metal wiring films 214a and 214b, so that the contact plugs 212a and 212b are electrically connected with the upper metal wiring films 214a and 214b.

According to the present invention as described above, a polymer is formed at a side of an upper electrode simultaneously while an insulating layer is etched, and the insulating layer protected by the polymer is formed to have a positive slope, so that the upper and lower electrodes of an MIM capacitor can be insulated. Therefore, in an MIM capacitor according to the present invention, leakage of current can be prevented, so that production of degraded MIM capacitors can be reduced and yield of the capacitors can be improved.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A method of fabricating a capacitor of a semiconductor device, the capacitor having a structure of metal-insulator-metal, the method comprising the steps of:

sequentially forming a first metal film, an insulator film, and a second metal film on a semiconductor substrate;

patterning a second metal film to form an upper electrode;

etching the insulator film using the upper electrode as a mask, and simultaneously forming a polymer at one side of the upper electrode;

etching the insulator film which is not protected by the polymer, thereby removing the insulator film; and removing the polymer formed at said one side of the upper electrode.

2. A method of fabricating a capacitor of a semiconductor device according to claim 1, wherein the first metal film is dry-etched by a plasma activated by combination of $Cl_2/BCL_3/N_2$ gas.

3. A method of fabricating a capacitor of a semiconductor device according to claim 1, wherein a positive slope having a single inclination is formed at a boundary between the insulator film and the polymer.

4. A method of fabricating a capacitor of a semiconductor device according to claim 1, wherein a positive slope having multiple inclinations is formed at a boundary between the insulator film and the polymer.

5. A method of fabricating a capacitor of a semiconductor device according to claim 1, wherein the polymer is formed using $CHF_3$ and $CF_4$ gas with a high pressure and source powers of middle level and lower levels are used, and the $CHF_3$ gas is used with a similar or higher percentage than that of the $CF_4$ gas.

6. A method of fabricating a capacitor of a semiconductor device according to claim 5, wherein the polymer is formed using $C_XF_Y$ gas instead of $CHF_3$ and $CF_4$ gas.

7. A method of fabricating a capacitor of a semiconductor device according to claim 1, further comprising the steps of:

forming interlayer insulator film on an entire surface of a first resultant lamination formed through above steps;

forming at least two via holes by etching the interlayer insulator film;

forming contact plugs by filling conductive metal in the via holes; and forming at least two upper metal wiring films on a second resultant lamination formed through above steps.

* * * * *